United States Patent [19]

Hanoka et al.

[11] Patent Number: 5,762,720
[45] Date of Patent: Jun. 9, 1998

[54] SOLAR CELL MODULES WITH INTEGRAL MOUNTING STRUCTURE AND METHODS FOR FORMING SAME

[75] Inventors: Jack I. Hanoka, Brookline, Mass.; Jefferson Shingleton, Auburn, N.Y.

[73] Assignee: Evergreen Solar, Inc., Waltham, Mass.

[21] Appl. No.: 673,806

[22] Filed: Jun. 27, 1996

[51] Int. Cl.$^6$ .................... H01L 31/048; H01L 31/18; E04D 13/18

[52] U.S. Cl. .................. 136/251; 52/173.3; 438/64; 438/66; 156/285; 156/306.3; 156/308.2; 156/309.6

[58] Field of Search .................. 136/251; 437/2–5, 437/207, 209, 211–212, 219; 156/285, 306.3, 308.2, 309.6; 52/173.3; 438/64, 66

[56] References Cited

U.S. PATENT DOCUMENTS

| | | | |
|---|---|---|---|
| 3,261,074 | 7/1966 | Beauzee et al. | 437/2 |
| 3,502,507 | 3/1970 | Mann et al. | 136/244 |
| 3,903,427 | 9/1975 | Pack | 250/208.2 |
| 3,903,428 | 9/1975 | DeJong | 136/244 |
| 3,990,100 | 11/1976 | Mamine et al. | 257/437 |
| 4,133,697 | 1/1979 | Frosch et al. | 136/245 |
| 4,135,290 | 1/1979 | Evans et al. | 437/2 |
| 4,173,820 | 11/1979 | Frosch et al. | 437/2 |
| 4,361,950 | 12/1982 | Amick et al. | 437/2 |
| 4,415,607 | 11/1983 | Denes et al. | 427/96 |
| 4,415,780 | 11/1983 | Daugherty et al. | 200/5 A |
| 4,543,444 | 9/1985 | Rasch et al. | 136/256 |
| 4,610,077 | 9/1986 | Minahan et al. | 437/2 |
| 4,692,557 | 9/1987 | Samuelson et al. | 136/251 |
| 4,755,866 | 7/1988 | Marshall et al. | 257/668 |
| 4,758,926 | 7/1988 | Herrell et al. | 361/699 |
| 4,849,028 | 7/1989 | Krause et al. | 136/259 |
| 4,860,444 | 8/1989 | Herrell et al. | 29/840 |
| 4,897,123 | 1/1990 | Mitsui et al. | 136/256 |
| 4,912,288 | 3/1990 | Atkinson et al. | 174/251 |
| 4,966,631 | 10/1990 | Matlin et al. | 136/244 |
| 5,055,907 | 10/1991 | Jacobs | 257/773 |
| 5,108,541 | 4/1992 | Schneider et al. | 216/19 |
| 5,116,459 | 5/1992 | Kordus et al. | 216/20 |
| 5,118,362 | 6/1992 | St. Angelo et al. | 136/256 |
| 5,143,556 | 9/1992 | Matlin | 136/244 |
| 5,151,377 | 9/1992 | Hanoka et al. | 437/2 |
| 5,180,442 | 1/1993 | Elias | 136/251 |
| 5,270,248 | 12/1993 | Rosenblum et al. | 437/160 |
| 5,425,816 | 6/1995 | Cavicchi et al. | 136/256 |
| 5,476,553 | 12/1995 | Hanoka et al. | 136/251 |
| 5,478,402 | 12/1995 | Hanoka | 136/251 |
| 5,478,407 | 12/1995 | Dorison et al. | 136/244 |
| 5,507,880 | 4/1996 | Ishikawa et al. | 136/251 |

FOREIGN PATENT DOCUMENTS

WO8912911 of 1989 WIPO.

OTHER PUBLICATIONS

Sauer et al., "Poly(methyl methacrylate) Based Ionomers. 1. Dynamic Mechanical Properties and Morphology," *Macromolecules*, 28:3953–3962 (1995).

Hara et al., "Solution Properties of Ionomers. 2. Simple Salt Effect," *Macromolecules*, 22:754–757 (1989).

Hara et al., "Fatigue Behavior of Ionomers. 3. Effect of Excess Neutralizing Agent on Sulfonated Polystyrene Ionomers," *Macromolecules*, 23:4964–4969 (1990).

(List continued on next page.)

*Primary Examiner*—Aaron Weisstuch
*Attorney, Agent, or Firm*—Testa, Hurwitz & Thibeault, LLP

[57] ABSTRACT

A laminated solar cell module includes an integral mounting structure. The solar cell module includes a rigid front support layer formed of light transmitting material having first and second surfaces. A transparent encapsulant layer has a first surface disposed adjacent the second surface of the front support layer. A plurality of interconnected solar cells have a first surface disposed adjacent a second surface of the transparent encapsulant layer. The backskin is formed of a thermoplastic olefin, which includes first ionomer, a second ionomer, glass fiber and carbon black. A first surface of the backskin is disposed adjacent a second surface of the interconnected solar cells. At least one mounting bracket is bonded directly to a second surface of the backskin layer.

22 Claims, 6 Drawing Sheets

OTHER PUBLICATIONS

Douglas et al., "Viscoelastic and Morphological Study of Ionic Aggregates in Ionomers and Ionomer Blends," *Macromolecules*, 27:4344–4352 (1994).

Tachino et al., "Structure and Properties of Ethylene Ionomers Neutralized with Binary Metal Cations," *Macromolecules*, 27:372–378 (1994).

Technical Information Bulletin (1993) pp. 1–2, Philadelphia Decal Co.

How to Use Decals in Decorating pp. 1–4, Philadelphia Ceramics, Inc. (Date Unknown).

"The Making of A Decal"; *The Plate Collector* (Dec. 1995) pp. 33–35.

Cavicchi et al.; "Large Area Wraparound Cell Development"; *17th IEEE* (1984) pp. 128–133.

Michaels et al.; "Large Area, Low Cost Space Solar Cells with Optional Wraparound Contacts"; *IEEE* (1981) pp. 225–227.

Mason et al.; "Development of 2.7 mil BSF and BSFR Silicon Wrapthrough Solar Cells"; *IEEE* (1990) pp. 1378–1382.

Gee et al.; "Emitter Wrap–Through Solar Cell"; *IEEE* (1993) pp. 265–270.

Thornhill; Final Report—"Automated Fabrication of Back Surface Field Silicon Solar Cells with Screen Printed Wraparound Contacts" (1977) pp. 1–30, Contract NAS3–20029, NASA Lewis.

A. Schulman Inc.; Formion®Formulated Ionomer Resins, pp. 1–3 (Date Unknown).

Philadelphia Decal (vol. I, Issue No. 2, Sep. 1993), pp. 1–2.

Baker et al.; Introduction of Acrylate Copolymer Based Ionomer Resins for Packaging Applications (Date Unknown).

SOLAR CELL MODULES WITH INTEGRAL MOUNTING STRUCTURE AND METHODS FOR FORMING SAME

GOVERNMENT INTEREST

The subject matter described herein was supported in part by Photovoltaic Manufacturing Technology (PVMaT) Contract No. ZAF-5-14271-09.

FIELD OF THE INVENTION

The invention relates to solar cell modules and methods for mounting such modules. More particularly, the invention relates to solar cell modules having an integral mounting structure and methods for mounting such solar cell modules.

BACKGROUND

In general, a solar cell module is formed by interconnecting individual solar cells and laminating the interconnected cells into an integral solar cell module. More specifically, the module usually includes a stiff transparent cover layer made of a polymer or glass material, a transparent front encapsulant which adheres to the cover material and to a plurality of interconnected solar cells, a rear encapsulant which can be transparent or any other color, a stiff backskin for protecting the rear surface of the module, a protective seal which covers the edges of the module, and a perimeter frame made of aluminum which covers the seal. The frame protects the edges of the module when the front cover is made of glass.

Before the frame is mounted, the module is laminated under heat and pressure. These conditions cause the layers of encapsulant material to melt, bond to adjacent surfaces, and to literally "encapsulate" the solar cells. Since crystalline silicon solar cells are usually brittle, the encapsulant serves to protect the solar cells and reduce breakage when the module is subject to mechanical stress during field usage. After the lamination process, the frame is attached to the module. The frame includes mounting holes which are used to mount the framed module to an object in the field. The mounting process requires screws, bolts, and nuts and can be accomplished in a variety of ways.

Because cost of existing methods for manufacturing solar cell modules tend to be too high, solar electricity is generally not cost-competitive for grid connected applications. For example, three areas in which manufacturing costs need to be reduced include: (i) the materials from which the modules are made; (ii) the labor required to deploy these materials; and (iii) the materials and labor associated with mounting the modules in the field. In particular, the cost of known backskin materials, the cost of the aluminum frame, and the cost of labor required for field mountings in remote areas are known to be too high.

One known method aimed at reducing solar cell module manufacturing costs includes eliminating the aluminum frame and using a polymeric material as both the backskin and the edging. For amorphous silicon solar cell modules, polymeric frames of a molded thermoplastic material are widely practiced. Reaction injection molding may be used to mold a polyurethane frame around an amorphous silicon module. Reaction injection molding is done in situ (i.e., on the module), and this is a significant cost savings advantage. However, this molding process has several disadvantages. For example, this process includes the use of a chemical precursor (e.g., isocyanate) which poses environmental hazards. This process also requires a mold, further adding to the overall manufacturing cost. In addition, modules made this way tend to be small (e.g., 5–10 Watt size), not the 50–80 Watt size more generally deployed using aluminum frames. The modules tend to be smaller because of the higher cost of the mold and the limited strength of the resulting polymeric frame with its integral mounting holes. As a result, reaction injection molding is marginally successful in reducing manufacturing costs for amorphous silicon solar cell modules.

For crystalline silicon modules, the backskin material is generally quite costly. There are two widely used backskin materials, both of which tend to be expensive. The most popular material used is a Tedlar®/polyester/ethylene vinyl acetate laminate, and the other widely used backskin material is glass. Two additional layers of material are often deployed between the solar cells in the module and the backskin, further adding to the manufacturing costs. A rear sheet of the same material as the transparent encapsulant, (e.g., Ethylene Vinyl Acetate) and a sheet of "scrim", which allows for efficient air removal during vacuum lamination, must be applied over the cells before the backskin material is deployed.

Both amorphous and crystalline silicon modules also include a junction box which is mounted onto the backskin material and from which all external electrical connections are made. Further labor is required to make connections to the junction box.

A frame, along with an elastomeric edging material, is often used when the front support for the module is formed of tempered glass. This construction protects the edges, as the tempered glass is vulnerable to breakage if an edge is damaged. While the use of a frame adds durability to the solar cell module, it also adds significantly to the manufacturing costs.

The labor intensive process of mounting the module can add significantly to the overall cost of solar electricity. Modules are mounted by assembling screws, nuts, and bolts to the appropriate mounting holes on the aluminum frame. However, solar cell modules are often located in remote areas which have no other source of electricity. As such, the mounting process often involves attaching the hardware in difficult, awkward and not readily accessible locations such as on rugged terrain, or roof tops.

The foregoing discussion demonstrates that the manufacture of solar cell modules tends to be too costly and involves too much labor to allow for the realization of the goal of cost-competitive solar electricity for wide-scale global use.

SUMMARY OF THE INVENTION

The invention features a solar cell module including at least one mounting bracket bonded directly to a backskin material. Mounting each bracket directly to the backskin material can eliminate the need for other mounting hardware and vastly simplifies the module mounting procedure. Thus, the additional costs associated with an aluminum frame and an edge sealing material, and the difficulties of installing hardware in remote locations are all eliminated with the present invention.

The backskin material is a thermoplastic olefin which may be composed of two different kinds of ionomer, mineral filler and a pigment. Ionomer is a generic name which herein refers to either a co-polymer of ethylene and methacrylic acid or acrylic acid, which has been neutralized with the addition of a salt which supplies a cation such as Na+, Li+, Zn++, Al+++, Mg++, etc., or a co-polymer of polyethylene and an acrylate to which cations such as those listed above have been added. The material has the usual covalent bonds which polymers typically have, but also has regions of ionic bonding. The latter imparts to the materials a built-in cross linking. Ionomers are characterized as being tough and weatherable polymers. The combination of two ionomers produces a known synergistic effect which improves the water vapor barrier properties of the material over and above the barrier properties of either of the individual ionomer components.

The addition of a mineral filler, such as glass fiber, to the backskin material provides for a lower coefficient of thermal expansion. This is important for preserving strong, long lasting bonds to all the adjacent surfaces in a module which undergoes ambient temperature extremes. The glass fibers also improve the water vapor and oxygen barrier properties of the material and increase the flexural modulus three or four times over the ionomers themselves. This makes the backskin material very strong, but still flexible. A pigment, such as carbon black, is added to the backskin material to provide excellent weathering properties (i.e. resistance to the degradation from the UV light in the solar spectrum).

In one aspect, the invention features a laminated solar cell module with an integral mounting structure. The module includes a front support layer formed of light transmitting material, such as glass, and having first and second surfaces. A transparent encapsulant layer, formed of at least one ionomer, is disposed adjacent the second surface of the front support layer. A first surface of a plurality of interconnected solar cells are disposed adjacent the transparent encapsulant layer. A backskin layer, formed of a thermoplastic olefin, has a first surface disposed adjacent a second surface of the interconnected solar cells. The transparent encapsulant layer and the backskin layer, in combination, encapsulate the interconnected solar cells.

In accordance with the invention, at least one mounting bracket, formed of a metallic or polymeric material, is bonded directly to a second surface of the backskin layer. In one embodiment, each mounting bracket is subjected to heat and pressure to bond it to the backskin without any adhesives. The mounting bracket is adapted to slidably engage a channel bracket, which may be mounted on a roof or the like, for easily mounting the module.

A portion of the backskin layer may be wrapped around at least one edge of the module for contacting the first surface of the front support layer, to thereby form an edge seal. The presence of acid functionality in the ionomers utilized in the backskin material yields the property of bonding cohesively, not merely adhesively, to various materials including glass, metals, and other polymers. This property is utilized to bond the mounting brackets directly to the backskin, which also can serve as an edge seal, without the need for additional adhesive materials.

In another aspect, the invention features a method of manufacturing a solar cell module. A front support layer is formed of light transmitting material (e.g., glass). A transparent encapsulant layer, formed of at least one ionomer, is placed adjacent a second surface of the front support layer. A plurality of interconnected solar cells having first and second surfaces are positioned adjacent the transparent encapsulant layer. A backskin layer formed of thermoplastic olefin is placed adjacent a second surface of the interconnected solar cells to thereby form an assembly. The assembly is laminated to form the solar cell module. At least one mounting bracket, formed of a metallic or polymeric material, is subjected to heat and pressure to bond it to the backskin without any adhesives.

In another aspect, the electrical leads for the module are coated with a polyolefin material (e.g., polyethylene) or a known blend of rubber and polypropylene. The polyolefin coated leads can be heated and bonded into the backskin material to form an integral seal. This embodiment (i) provides a superior approach for bringing the leads out of the module, (ii) eliminates the ingress of moisture, and (iii) eliminates the need for a junction box entirely.

In yet another aspect, a solar cell module employing the above-described backskin material is bonded directly to the exterior surface of an architectural building material (e.g., aluminum, concrete, stone or glass). The above-described electrical leads can be brought out through holes in the building material.

BRIEF DESCRIPTION OF THE DRAWINGS

FIGS. 5a–7a are a series of cross-sectional views of a lamination process for a solar cell with edge seal and edge protection components.

FIG. 5b–6b are series of cross-sectional views of another lamination process for a solar cell with edge seal and edge protection components.

DETAILED DESCRIPTION

Figure 1A:
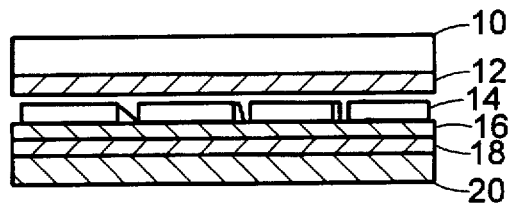
FIG. 1B is a cross-sectional view of a conventional module with a glass backskin.
FIG. 1 C is a cross-sectional view of a conventional module with a perimeter aluminum frame.
Figure 1B:
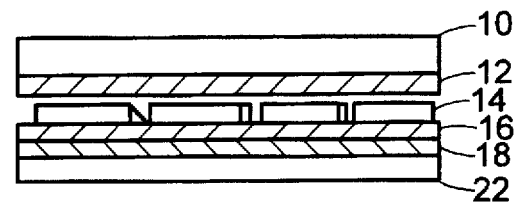
Figure 1C:
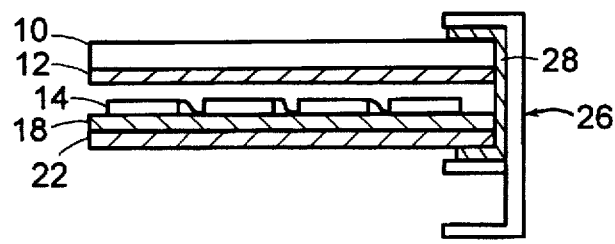

FIGS. 1A, 1B, and 1C are cross-sectional views of conventional solar cell modules. FIG. 1A shows a module with a transparent front support layer 10 of glass or polymer disposed on a transparent encapsulant layer 12. The encapsulant layer is disposed on an array of interconnected solar cells 14, which is disposed on a scrim layer 16. The scrim layer is disposed on a rear encapsulant layer 18, which is disposed on a backskin 20. The backskin 20 may be a Tedlar® laminate of about ten-thousandths of an inch thickness. FIG. 1 B shows another module having the same configuration as the module shown in FIG. 1A, except that the backskin 22 is formed of a sheet of glass. The assembly shown in FIG. A or FIG. 1B is laminated by subjecting the assembly to heat and pressure in a vacuum laminator using a known process.

Referring to FIG. 1C, the scrim layer 16 is absorbed into the rear encapsulant sheet 18 during lamination and is not therefore shown. A perimeter frame 26, typically aluminum, is mounted to surround the edges of the module and a sealing material 28 seals the edges. The sealing material 28, in the form of a strip of tape or a caulking type compound, is applied to the edges. Subsequently, sections of the perimeter frame 26 are fastened onto the module and joined together at the corners.

The invention features a solar cell module having an improved backskin material which significantly reduces manufacturing costs. This is accomplished by eliminating certain materials which are conventionally used in the construction of prior art modules and by simplifying the steps required to make the module. More particularly, the improved backskin material eliminates the need for a rear encapsulant layer, for a scrim layer, for a sealing strip or sealing material at the module edges, and for the requirement of a perimeter frame of aluminum.

Figure 2:
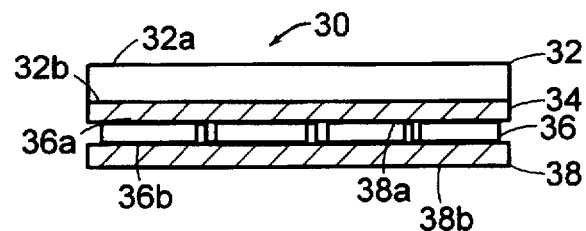
FIG. 2 is a cross-sectional view of a solar cell module with the improved backskin material of the invention.

FIG. 2 shows a solar cell module including the improved backskin material. The module 30 includes a front support layer 32 formed of light transmitting material (e.g., glass) and having front and rear surfaces (32a, 32b). A transparent encapsulant layer 34 is disposed over the rear surface 32b of the front support layer. A first surface 36a of a plurality of interconnected solar cells 36 is disposed over the transparent encapsulant layer 34. A flexible backskin layer 38 has a first surface 38a disposed adjacent the second surface 36b of the interconnected solar cells. A laminated module is formed by placing the module in a laminator and subjecting it to heat and pressure. The lamination process causes the transparent encapsulant layer 34 and the backskin material 38 to melt and bond to the interconnected solar cells 36 and other adjacent surfaces. Once the lamination process is complete, the transparent encapsulant layer 34 and the backskin layer 38, in combination, encapsulate the interconnected solar cells 36.

In accordance with the invention, the backskin material 38 is a thermoplastic polyolefin including a mixture of at least two ionomers. In one detailed embodiment, the backskin is a flexible sheet of thermoplastic polyolefin which includes a sodium ionomer, a zinc ionomer, 10-20% glass fibers, and about 5% carbon black and has a thickness of about 0.040 inches. The carbon black is added to provide excellent resistance to weathering effects due to UV sunlight and atmospheric conditions. Thus, the material 38 combines the features of flexibility, elasticity, strong cohesive bonding to certain surfaces (e.g., glass, metal and polymer), toughness, and excellent resistance to UV light degradation. As a result of these properties and advantages, the use of this material results in significant cost savings in the manufacture of solar cell modules.

Figure 3:
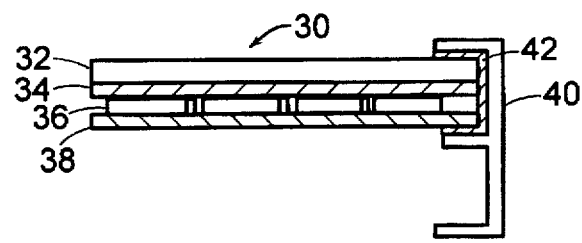
FIG. 3 is a cross-sectional view of a solar cell module with the improved backskin material of the invention and mounted in a perimeter aluminum frame using a sealant.

Referring to FIG. 3, the module can be fitted with a frame. In one embodiment, a perimeter frame 40 of metallic material can be secured to the module 30. A sealant 42 may be applied to the module edges to seal the frame 40 to the module 30. Alternatively, the backskin can be wrapped around the edges of the module (see, FIG. 4), and the frame heated and bonded directly to the wrapped portion of the backskin material without any adhesive or bonding agent. In another embodiment, instead of using a perimeter frame, a plurality of mounting brackets are heated and then bonded directly to the backskin material without any adhesive or bonding agent. These aluminum pieces then become slides which allow the module to be slid into place by sliding it along channel brackets (see, FIGS. 13–18).

Figure 4:
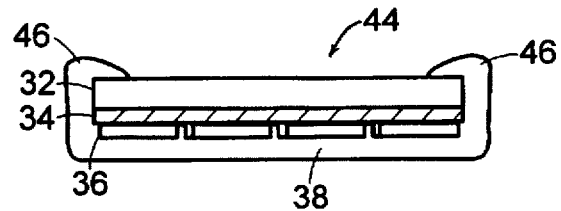
FIG. 4 is a cross-sectional view of a solar cell module with the improved backskin material wrapped around the assembly to form an edge seal.

FIG. 4 shows a solar cell module 44 in which portions 46 of the improved backskin material 38 is wrapped around the edges of the assembly and bonds to the solar cells 36, the transparent front encapsulant 34 and the front support layer 32. In this configuration, the backskin material 38 provides four functions: (i) the backskin, (ii) the rear encapsulant, (iii) the edge protector, and (iv) the edge sealant. As noted previously, the module 44 can be fitted with various types of frames.

Figure 5A:
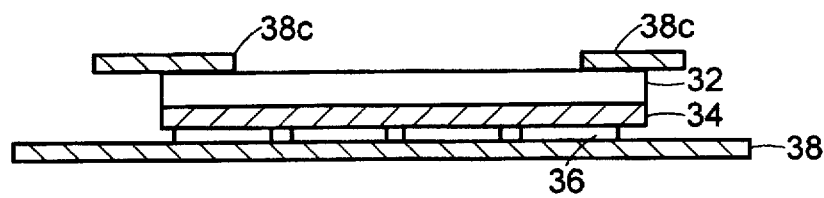
Figure 6A:
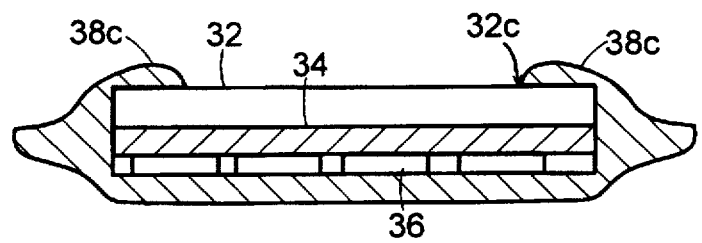
Figure 7A:
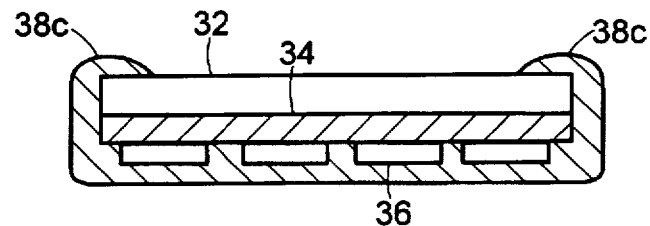

FIGS. 5a–7a show a processing sequence used to form the solar cell module shown in FIG. 4. Referring to FIG. 5a, a sheet of backskin material 38 about one inch wider than the cover layer 32 is positioned adjacent the interconnected solar cells 36. Narrow strips of the backskin material 38c are laid down along the perimeter of the cover layer 32 with the strips overlapping at the corners. The assembly is then placed in a laminator and subjected to heat and pressure with temperatures on the order of 150° C. FIG. 6a illustrates the laminated module. As shown, the backskin 38 and perimeter strips 38c have completely melted together and formed a tight seal along the edge 32c of the front surface of the cover layer 32. Without the need for a mold of any kind, the lamination of a module with the improved backskin yields edge protection and edge sealing. Any excess backskin material can easily be trimmed off to provide the finished module illustrated in FIG. 7a.

Figure 5B:
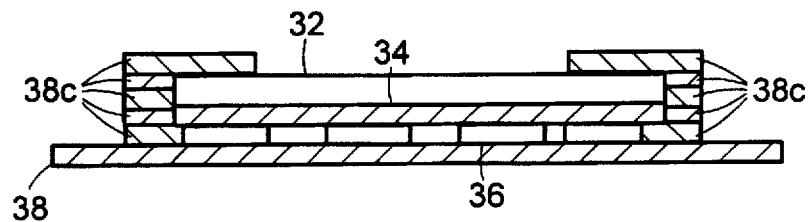
Figure 6B:
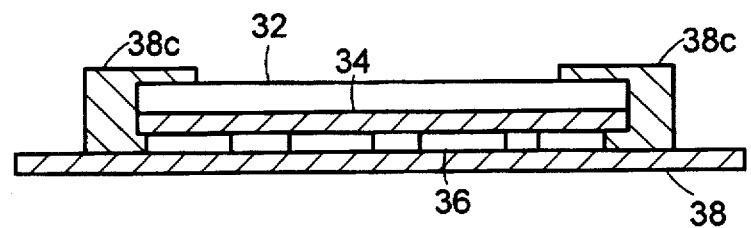

FIGS. 5b–6b show a processing sequence used to form another solar cell module. Referring to FIG. 5b, the module is the same as that described in connection with FIG. 5a, except that a plurality of narrow strips of the backskin material 38c are stacked along the perimeter of the cover layer 32. The assembly is then placed in a laminator and subjected to heat and pressure. FIG. 6b illustrates the laminated module. As shown, the backskin 38 and perimeter strips 38c have completely melted together and formed a tight seal along the front surface of the cover layer 32. With this process, there is no need to trim excess backskin material as described in connection with FIG. 6a.

Figure 8:
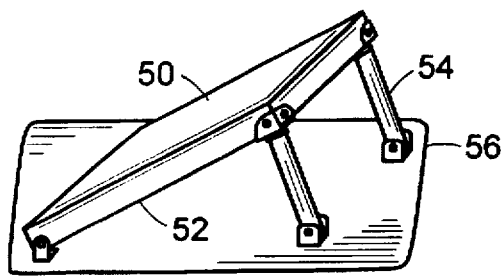
FIG. 8 illustrates a conventional ground mounting method of a solar cell module.
Figure 9:
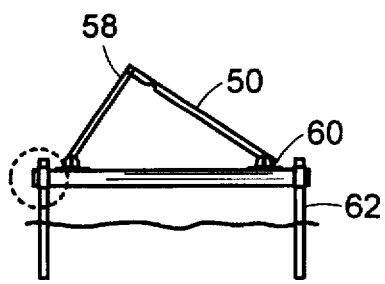
FIG. 9 illustrates another conventional ground mounting method of a solar cell module.
Figure 10:
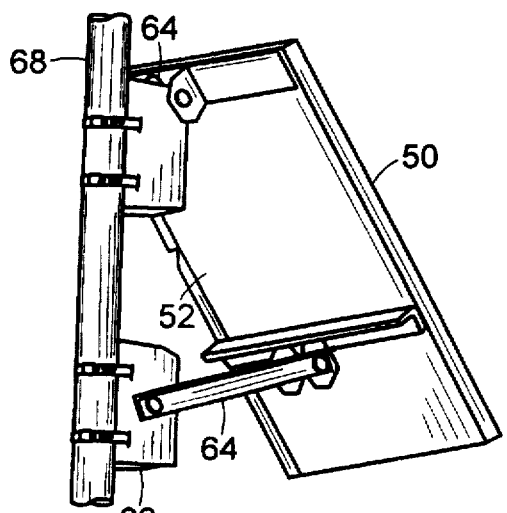
FIG. 10 illustrates a conventional pole mounting method of a solar cell module.
Figure 11:
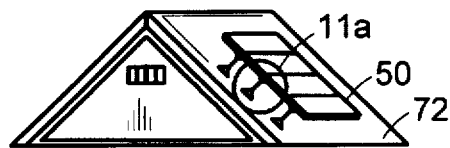
FIG. 11 illustrates a conventional roof mounting method of a solar cell module.
Figure 11A:
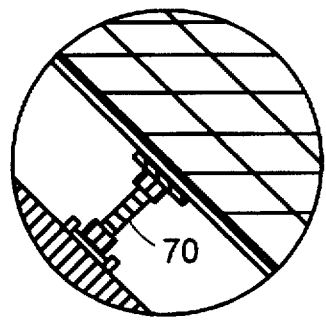
Figure 12:
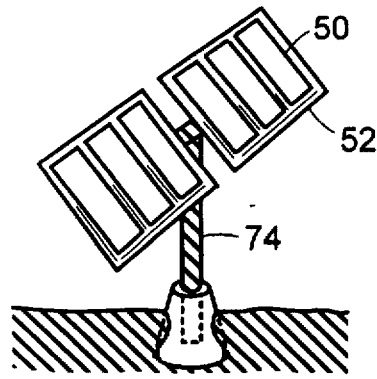
FIG. 12 illustrates a conventional solar cell mounting method which includes ground mounted pole and one axis tracking.

FIGS. 8–12 illustrate conventional means for mounting modules. In FIG. 8, the solar cell module 50 and the aluminum frame 52 are mounted to metallic mounts 54. These mounts 54 are, in turn, mounted to a metallic structure 56 or to cement. In FIG. 9, the module 50 is connected to a support member 58 which, in turn, is joined to other metal support members 60, 62. In FIG. 10, cross members 64 are mounted to other pieces 66 and directly to a pole 68. In FIG. 11, the module 50 is placed on jacks (or standoffs) 70 which are attached to the roof 72. FIG. 12 shows a pole mounting scheme for tracking in which modules 50 are mounted in a metal structure 52 connecting the module frames.

Figure 13:
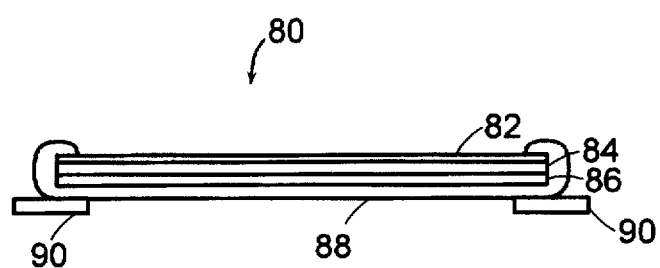
FIG. 13 is a cross-sectional view of a solar cell module of FIG. 7, modified to include mounting bracket bonded to the backskin material.
Figure 14:
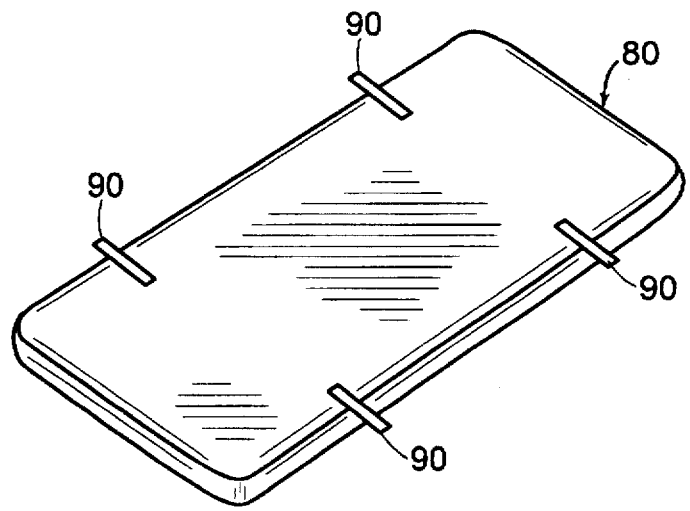
FIG. 14 is a rear view of the solar cell module of FIG. 13.

The invention features a solar cell module including an improved mounting structure. Referring to FIG. 13, a solar cell module 80 includes a front support layer 82, a transparent front encapsulant 84, solar cells 86 and the improved backskin material 88. As shown, the backskin 88 is wrapped around the edges of the assembly and bonds to the solar cells 86, the transparent front encapsulant 84 and the front support layer 82. Extruded mounting brackets 90, which may be aluminum or polymeric material(e.g., high density polyethylene) are heated and bonded directly to rear surface of the backskin material. FIG. 14 is a plan view of the module 80 including four mounting brackets 90. In another embodiment, the module may include two mounting brackets (not shown) extending across the rear surface of the backskin material.

Figure 15:
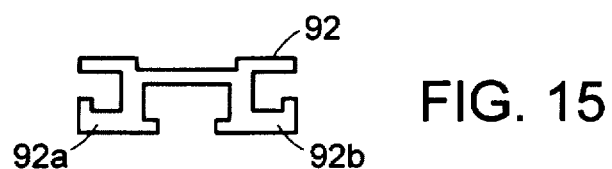
FIG. 15 is a cross-sectional view of an extruded mounting bracket.
Figure 16:
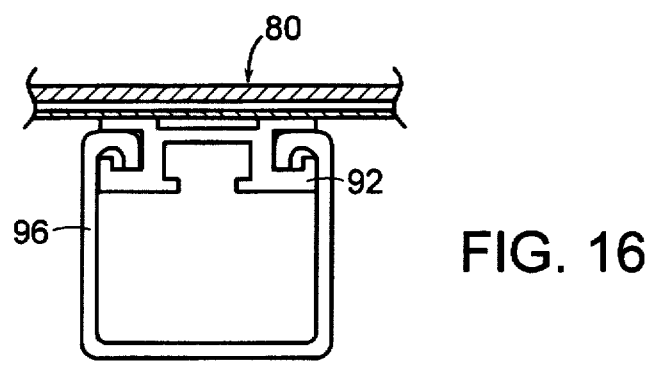
FIG. 16 is a cross-sectional view of the mounting bracket of FIG. 15 slidably engaging a channel bracket.
Figure 17:
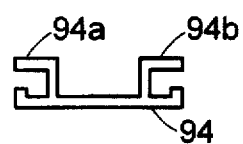
FIG. 17 is a cross-sectional view of an alternative extruded mounting bracket.

FIGS. 15 and 17 illustrate two possible configuration of extruded mounting brackets (92, 94). In both configurations, the bracket include two C-shaped members (92a, 92b or 94a, 94b) connected by linear member. As described below, these brackets slidably engage a channel bracket for mounting a module. The C-shaped members (92a, 92b or 94a, 94b) provide stiffness and permit secure engagement to the channel bracket. The linear member is multifunctional in that it allows for various mounting configurations to the channel bracket as explained below (see FIGS. 16, 19 and 20). Also, a molded plastic insert (not shown) may be inserted adjacent the linear member and between the C-shaped members. The insert wraps around the bottom and sides of the C-shaped members and engages the channel bracket to accomodate tolerance differences along the channel bracket and C-shaped members.

Figure 18:
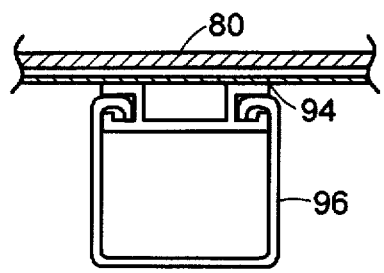
FIG. 18 is a cross-sectional view of the mounting bracket of FIG. 17 slidably engaging a channel bracket.

FIG. 16 illustrates a module mounted to channel bracket disposed on a structure (e.g., a roof, a pole, or the ground). A module 80 includes including a mounting bracket 92 directly mounted to the backskin 88. The C-shaped members 92a, 92b slidably engage a channel bracket 96 secured to a structure (not shown). As such, the module 80 can be easily slid along the channel bracket 96 to a desired location. FIG. 18 illustrates a module mounting configuration using the mounting bracket 94 shown in FIG. 17.

Figure 19:
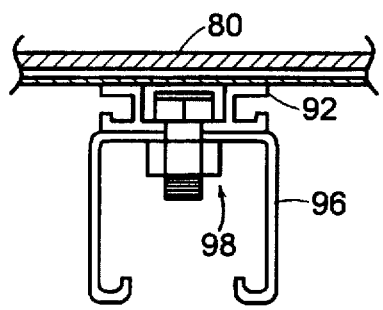
FIG. 19 is a cross-sectional view of the mounting bracket of FIG. 17 slidably engaging a channel bracket using a bolt.
Figure 20:
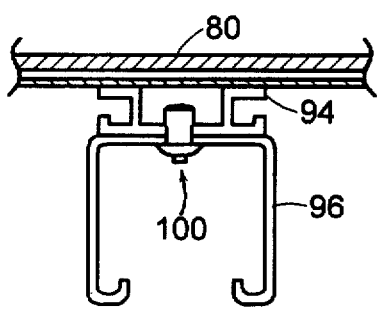
FIG. 20 is a cross-sectional view of the mounting bracket of FIG. 17 slidably engaging a channel bracket using a rivet.

FIGS. 19 and 20 illustrate alternative mounting configurations. In FIG. 19, the module 80 includes including an inverted mounting bracket 92 directly mounted to the backskin 88. The C-shaped members 92a, 92b are secured via a bolt 98 to the channel bracket 96. In FIG. 20, an inverted mounting bracket 94 is secured via a rivet 100 to the channel bracket 96.

Figure 21:
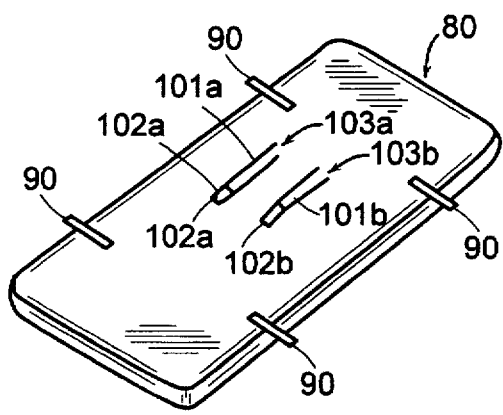
FIG. 21 is an illustration of a solar cell module with polyolefin covered leads bonded directly to the backskin.

FIG. 21 illustrates an embodiment in which the electrical leads for the module are coated with a polyolefin material (e.g., polyethylene) or a known blend of rubber and polypropylene. The two electrical leads (102a, 102b) are covered with a polyolefin material (101a, 101b) and bonded into the backskin material (103a, 103b). As such, the coated leads form an integral seal and no junction box is required on the module.

Figure 22:
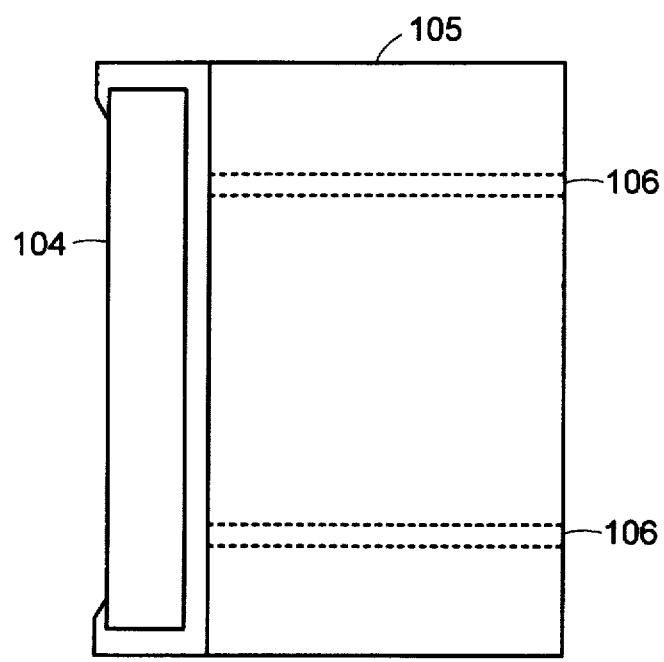
FIG. 22 is an illustration of the module of FIG. 4 bonded directly to the outer surface of an architectural building material.

FIG. 22 illustrates an embodiment in which the module 104 (see FIG. 4) is bonded directly to the exterior surface of an architectural building material 105 (e.g., aluminum, concrete, stone or glass). The exterior surface (or the backskin material) is heated and the module is bonded directly to the building material. The electrical leads (not shown), formed as described in connection with FIG. 21, are brought out through holes 106 in the building material and extend into the interior of the building.

Equivalents

While the invention has been particularly shown and described with reference to specific preferred embodiments, it should be understood by those skilled in the art that various changes in form and detail may be made therein without departing from the spirit and scope of the invention as defined by the appended claims.

We claim:

1. A laminated solar cell module comprising:

a front support layer formed of light transmitting material and having first and second surfaces;

a transparent encapsulant layer disposed adjacent the second surface of the front support layer;

a plurality of interconnected solar cells having a first surface disposed adjacent the transparent encapsulant layer;

a backskin layer formed of a thermoplastic olefin comprising at least a first ionomer and a second ionomer and having a first surface disposed adjacent a second surface of the interconnected solar cells; and at least one mounting bracket bonded directly to a second surface of the backskin layer.

2. The solar cell module of claim 1 wherein the at least one mounting bracket slidably engages a channel bracket.

3. The solar cell module of claim 1 wherein the at least one bracket is formed from metallic or polymeric material.

4. The solar cell module of claim 3 wherein the metallic material is aluminum.

5. The solar cell module of claim 3 wherein the polymeric material is high density polyethylene.

6. The solar cell module of claim 1 wherein the transparent encapsulant layer and the backskin layer, in combination, encapsulate the interconnected solar cells.

7. The solar cell module of claim 1 wherein the backskin layer is flexible.

8. The solar cell module of claim 1 wherein the thermoplastic olefin further comprises a mineral filler.

9. The solar cell module of claim 8 wherein the mineral filler is glass fiber.

10. The solar cell module of claim 1 wherein the thermoplastic olefin further comprises a pigment.

11. The solar cell module of claim 10 wherein the pigment is carbon black.

12. The solar cell module of claim 1 wherein a portion of the backskin layer is wrapped around at least one edge of the module for contacting the first surface of the front support layer, to thereby form an edge seal.

13. The solar cell module of claim 1 wherein the front support layer is glass.

14. The solar cell module of claim 1 wherein the transparent encapsulant layer comprises at least one ionomer.

15. A method of manufacturing a solar cell module comprising:

providing a front support layer formed of light transmitting material and having first and second surfaces;

placing a transparent encapsulant layer adjacent the second surface of the front support layer;

positioning a plurality of interconnected solar cells having first and second surfaces adjacent the transparent encapsulant layer;

placing a backskin layer formed of thermoplastic olefin comprising at least a first ionomer and a second ionomer adjacent a second surface of the interconnected solar cells to thereby form an assembly;

laminating the assembly to encapsulate the interconnected solar cells with the encapsulant layer and the backskin layer; and bonding at least one mounting bracket directly to a second surface of the backskin layer.

16. The method of claim 15 wherein the bonding step comprises subjecting the at least one mounting bracket to heat and pressure bond the at least one mounting bracket to said second surface of the backskin layer.

17. The method of claim 15 further comprising slidably engaging the at least one mounting bracket in a channel bracket.

18. The method of claim 15 further comprising wrapping a portion of the backskin layer around at least one edge of the assembly for contacting the first surface of the front support layer to form an edge seal.

19. A laminated solar cell module comprising:

a rigid front support layer formed of light transmitting material and having first and second surfaces;

a transparent encapsulant layer having a first surface disposed adjacent the second surface of the front support layer;

a plurality of interconnected solar cells having a first surface disposed adjacent a second surface of the transparent encapsulant layer;

a backskin layer formed of a thermoplastic olefin comprising at least a first ionomer and a second ionomer and having a first surface disposed adjacent a second surface of the interconnected solar cells, a portion of the backskin layer being wrapped around at least one edge of the module for contacting the first surface of the front support layer to form an edge seal;

the transparent encapsulant layer and the backskin layer, in combination, encapsulating the interconnected solar cells; and at least one mounting bracket bonded directly to a second surface of the backskin layer.

20. A method of manufacturing a solar cell module comprising:

providing a front support layer formed of light transmitting material and having first and second surfaces;

placing a transparent encapsulant layer adjacent the second surface of the front support layer;

positioning a plurality of interconnected solar cells having first and second surfaces adjacent the transparent encapsulant layer;

placing a backskin layer formed of thermoplastic olefin comprising at least a first ionomer and a second ionomer adjacent a second surface of the interconnected solar cells to thereby form an assembly;

wrapping an end portion of the backskin layer around at least one edge of the assembly for contacting the first surface of the front support layer, to form an edge seal; and laminating the assembly to encapsulate the interconnected solar cells with the encapsulant layer and the backskin layer; and bonding at least one mounting bracket directly to a second surface of the backskin layer.

21. A laminated solar cell module comprising:

a stiff front support layer formed of light transmitting material and having first and second surfaces;

a transparent encapsulant layer formed of at least one ionomer and disposed adjacent the second surface of the front support layer;

a plurality of interconnected solar cells having a first surface disposed adjacent the transparent encapsulant layer;

a flexible backskin layer formed of a thermoplastic olefin comprising at least a first ionomer and a second ionomer and having a first surface disposed adjacent a second surface of the interconnected solar cells;

the transparent encapsulant layer and the backskin layer, in combination, encapsulating the interconnected solar cells; and at least one mounting bracket bonded directly to a second surface of the backskin layer.

22. A method of manufacturing a solar cell module comprising:

providing a stiff front support layer formed of light transmitting material and having first and second surfaces;

placing a transparent encapsulant layer formed of at least one ionomer adjacent the second surface of the front support layer;

positioning a plurality of interconnected solar cells having first and second surfaces adjacent the transparent encapsulant layer;

placing a flexible backskin layer formed of thermoplastic olefin comprising at least a first ionomer and a second ionomer adjacent a second surface of the interconnected solar cells to thereby form an assembly;

subjecting the assembly to heat and pressure to encapsulate the interconnected solar cells with the encapsulant layer and the backskin layer; and bonding at least one mounting bracket directly to a second surface of the backskin layer.

* * * * *